United States Patent [19]

Kim

[11] Patent Number: 5,402,063
[45] Date of Patent: Mar. 28, 1995

[54] MOMENTARY TEST MODE ENABLING CIRCUIT

[75] Inventor: Hag K. Kim, Kyungki-Do, Rep. of Korea

[73] Assignee: Goldstar Electron Co., Ltd., Choongchungbook-do, Rep. of Korea

[21] Appl. No.: 913,323

[22] Filed: Jul. 15, 1992

[30] Foreign Application Priority Data

Jul. 15, 1991 [KR] Rep. of Korea ............... 12043/1991

[51] Int. Cl.⁶ ........................................... G01R 1/04
[52] U.S. Cl. ................................. 324/158.1; 327/77; 327/206
[58] Field of Search ................. 324/158 R; 307/329, 307/234; 328/206

[56] References Cited

U.S. PATENT DOCUMENTS

| | | | |
|---|---|---|---|
| 4,295,062 | 10/1981 | Mihalich et al. | 307/279 |
| 4,301,379 | 11/1981 | Reinert | 307/290 |
| 4,336,495 | 6/1982 | Hapke | 324/158 |
| 4,471,235 | 9/1984 | Sakhuja et al. | 307/234 |
| 4,727,270 | 2/1988 | Payne | 307/540 |
| 4,733,168 | 3/1988 | Blankenship et al. | |

*Primary Examiner*—Kenneth A. Wieder
*Assistant Examiner*—Barry C. Bowser
*Attorney, Agent, or Firm*—Lowe, Price, LeBlanc & Becker

[57] ABSTRACT

A momentary test mode enabling circuit capable of enabling the test mode using a negative pulse signal below the ground voltage level and of inputting normal operational inputs to the input pin even in the period of test mode, The circuit comprising a level detecting unit for detecting a level of an input signal being inputted to the input pin, a Schmitt trigger unit for stabilizing the level of the signal detected at the level detecting unit and outputting clock signals, and a toggle and latch section for outputting a test enabling signal upon the control of the clock signals from the Schmitt trigger unit. By use of the Schmitt trigger circuit, the input level detection signal is stabilized, thus increasing the noise margin and the test enabling and disabling operations may be easily carried out by the negative change of a momentary input signal.

9 Claims, 4 Drawing Sheets

MOMENTARY TEST MODE ENABLING CIRCUIT

BACKGROUND OF THE INVENTION

1. Field of the Invention

The present invention relates to an enabling-circuit for enabling a momentary test mode of integrated circuits and more particularly to, a momentary test mode enabling circuit for enabling a test mode by use of a negative pulse signal below a ground potential which makes it possible to input a normal operational signal to an input pin during the test mode so that momentary enabling and disabling operations may be carried out.

2. Description of the Prior Art

In general, test mode enabling circuits are used in memory devices and various types of test mode enabling circuits are well known in the art. One conventional test mode enabling circuit is disclosed in U.S. Pat. No. 4,733,168(Blankenship et al.). The conventional test mode enabling circuit, as shown in FIG. 1, comprises a level detecting circuit 2 for detecting a level of an input pin 1, an inverter gate 3 for inverting and buffering the detection signal from the level detecting circuit 2, and a limiting circuit 4 for limiting a maximum and a minimum values of the level being inputted to the input pin 1.

The level detecting circuit 2 is constituted such that a source of an NMOS transistor M1 is connected to the input pin 1 through a resistor R1, the drain and gate of NMOS transistor M1 are connected in common to a source of an NMOS transistor M2, a gate of the NMOS transistor M2 is grounded, the drain of the NMOS transistor M2 is connected in common to an emitter of a bipolar transistor Q1 and a source of an NMOS transistor M3, the drain and gate of the NMOS transistor M3 are connected to a power source $V_{DD}$, the base of the bipolar transistor Q1 is grounded, and the collector thereof is connected to a power source $V_{DD}$.

The limiting circuit 4 limits the maximum and minimum values of a level being inputted to the input pin 1 so as to protect other peripheral circuits from a surge which may be applied to the input pin 1.

The inverter gate 3 inverts the level of an input signal which is detected at the level detecting circuit 2 so that the indefinite level detection signal of the level detecting circuit 2 may be outputted as a correct high level or low level signal.

Since the gate of the NMOS transistor M2 is grounded, an input signal of a level that threshold voltages 2 $V_T$ of the NMOS transistors M2 and M1 are subtracted from the ground potential has to be applied in order to turn on the NMOS transistors M1 and M2. Also, since the base of the bipolar transistor Q1 is grounded, the minimum value of the potential of a connection node N1 at the emitter side of the bipolar transistor Q1 is limited by the value obtained by subtracting a threshold voltage of the bipolar transistor Q1 from the ground potential.

When the basic conditions of the circuit are determined and the level of the input voltage $V_{IN}$ being applied to the input pin 1 is in a normal state, that is, the level of the input voltage $V_{IN}$ is between the ground potential and the Dower source voltage, the NMOS transistors M1 and M2 are in a turn-off state and a voltage of a level $V_{DD}-V_{TN}$ is generated at the connection node N1 through the NMOS transistor M3 which is always in a turn-on state, and the voltage is applied to the inverter gate 3. Thus, the output signal of the inverter gate 3 comes to the ground level.

Meanwhile, the level of the input voltage $V_{IN}$ being applied to the input pin 1 drops down below ground level, the NMOS transistor M1 is turned on so that the electric charges at the connection node are discharged through the NMOS transistor M1.

In other words, when the input level $V_{IN}$ drops down below $GND-V_{TN}$, the NMOS transistor M2 is turned on and the level at the node N1 drops down.

At this moment, when the level at the node N1 drops down to the ground level GND, the voltage between the drain and the source of the NMOS transistor M3 becomes equivalent to the voltage between its gate and source and thus the NMOS transistor M3 becomes saturated.

Accordingly, the level at the node N1 is maintained at the ground level GND and the output of the inverter gate 3 becomes a high level signal, thereby enabling the test mode.

In such a conventional circuit, a lot of power loss occurs due to a static current during the test mode enabling period, and since the high level at the node N1 which is an input of the inverter gates M4 and M5 becomes $V_{DD}-V_{TN}$, the noise margin is insufficient. Also, since the inverter gates are used to detect the level at the node N1, the switching characteristics of the connection node N3 are bad.

SUMMARY OF THE INVENTION

Accordingly, it is an object of the present invention to provide a momentary test mode enabling circuit in which a normal operational signal is input to an input pin during a test mode period.

Another object of the present invention is to provide a momentary test mode enabling circuit which is capable of enabling a momentary test mode by use of a negative pulse to reduce a power loss and obtain a momentary enabling and disabling operations.

It is further object of the present invention to provide a momentary test mode enabling circuit which is capable of enabling a stable momentary test mode by increasing a noise margin.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

Briefly described, the present invention relates to a momentary test mode enabling circuit which comprises a level detecting unit for detecting a level of an input signal input to an input pin, a Schmitt trigger unit for stabilizing the level detected at the level detecting unit and outputting the stabilized signal as a clock signals, and a toggle and latch unit controlled by the clock signal from the Schmitt trigger unit to output a test enable signal.

The level detecting unit is constituted such that a detection signal of a ground voltage level is output when the level of the input signal being input to the input pin is below the ground voltage level and a detection signal of a power source voltage level is output when the level of the input signal being input to the input pin is greater than the ground voltage level.

The Schmitt trigger unit includes a first inverter gate for inverting an output from the level detecting unit, a second inverter gate for inverting an output signal from the first inverter gate and outputting a non-inverting clock signal a second PMOS transistor for charging a connection node between the first inverter gate and the second inverter gate with the power supply voltate upon the control of the non-inverting clock signal from the second inverter gate, an NMOS transistor for discharging the connection node between the first inverter gate and the second inverter gate into the ground voltage upon the control of the non-inverting clock signal from the second inverter gate, and a third inverter gate for inverting the non-inverting clock signal from the second inverter gate into an inverting clock signal.

The toggle and latch unit includes a toggle section for generating and latching a control signal for generating a test mode enabling signal in response to the clock signals from the Schmitt trigger unit, transmitting the control signal and toggling the control signal by a toggle signal being fed back, and a latch section for outputting a test enabling signal in response to the control signal being transmitted from the toggle section upon the control of the clock signals from the Schmitt trigger unit, latching the test enabling signal and feeding back a toggle signal to the toggle section.

The toggle section includes a PMOS transistor for charging up a control signal generation node upon the control of a reset signal, an NMOS transistor for forming a discharge loop of the control signal generation node upon the control of the reset signal, a fourth inverter gate for inverting the control signal from the control signal generation node, a first transmission gate for transmitting an output signal from the fourth inverter gate as a charge control signal or a discharge control signal of the control signal generation node upon the control of the clock signals from the Schmitt trigger unit, a PMOS transistor for charging up the control signal generation node between the control signal generation node and the NMOS transistor based on the output signal from the fourth inverter gate which has passed through the first transmission gate and the toggle signal which has been fedback at the latch section; and a second transmission gate for transmitting the control signal from the control signal generation node to the latch section upon the control of the clock-signals from the Schmitt trigger unit.

The latch section includes a fifth inverter gate for inverting the control signal for generating the test mode enabling signal transmitted from the toggle section and outputting a test enabling signal, a sixth inverter gate for inverting the test enabling signal a third transmission gate for feeding back an output signal from the sixth inverter gate to the toggle section as a toggle signal upon the control of the clock signals of the Schmitt trigger unit, and a fourth transmission gate for feeding back or output signal from the sixth inverter gate to the fifth inverter gate as an input signal upon the control of the clock signals of the Schmitt trigger unit.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 4A to 4D are waveform views of respective units in the circuit of FIG. 3, in which:

FIG. 4A is a waveform view of an input signal;

FIG. 4B is a wave form view of an input level detection node;

FIG. 4C is a waveform view of an inverting clock signal; and

FIG. 4D is wave form view of a test enabling signal.

DESCRIPTION OF THE PREFERRED EMBODIMENTS

Figure 1:
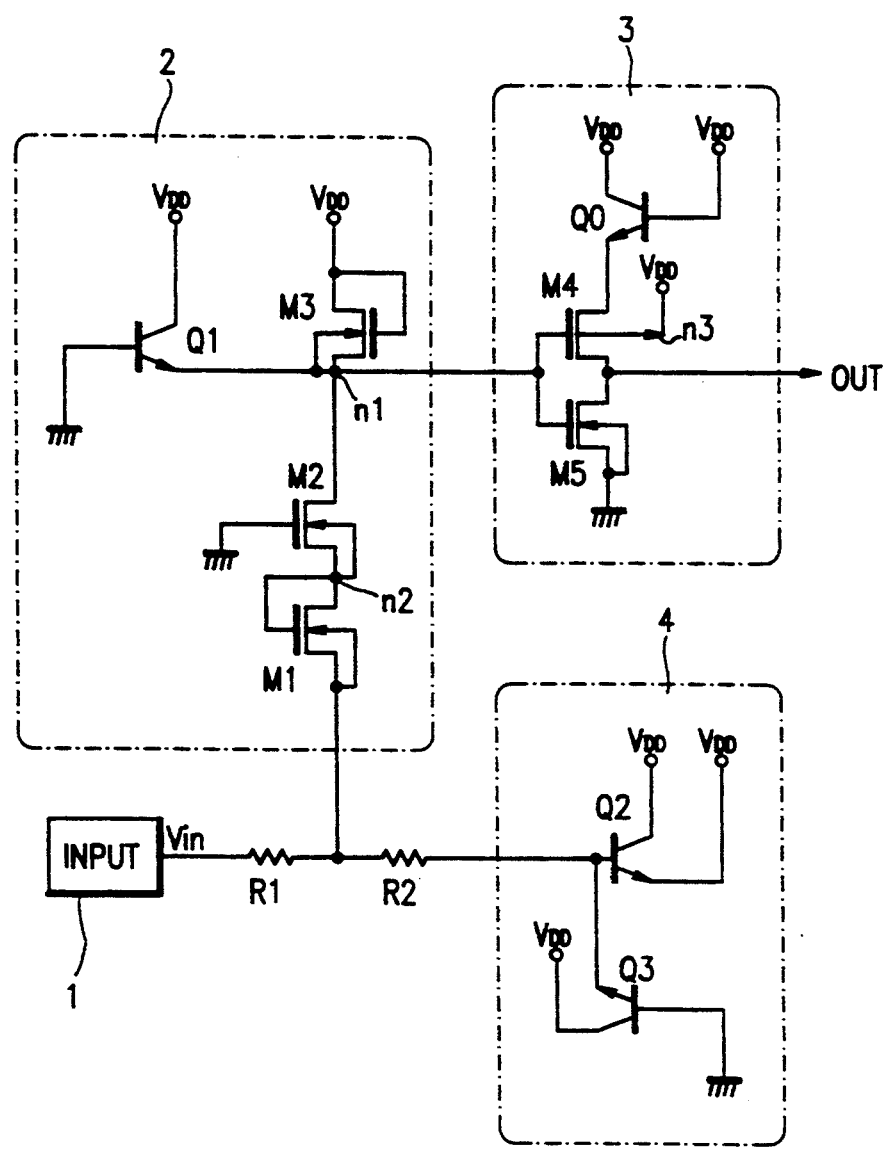
FIG. 1 is a diagram of a conventional test mode enabling circuit.
Figure 2:
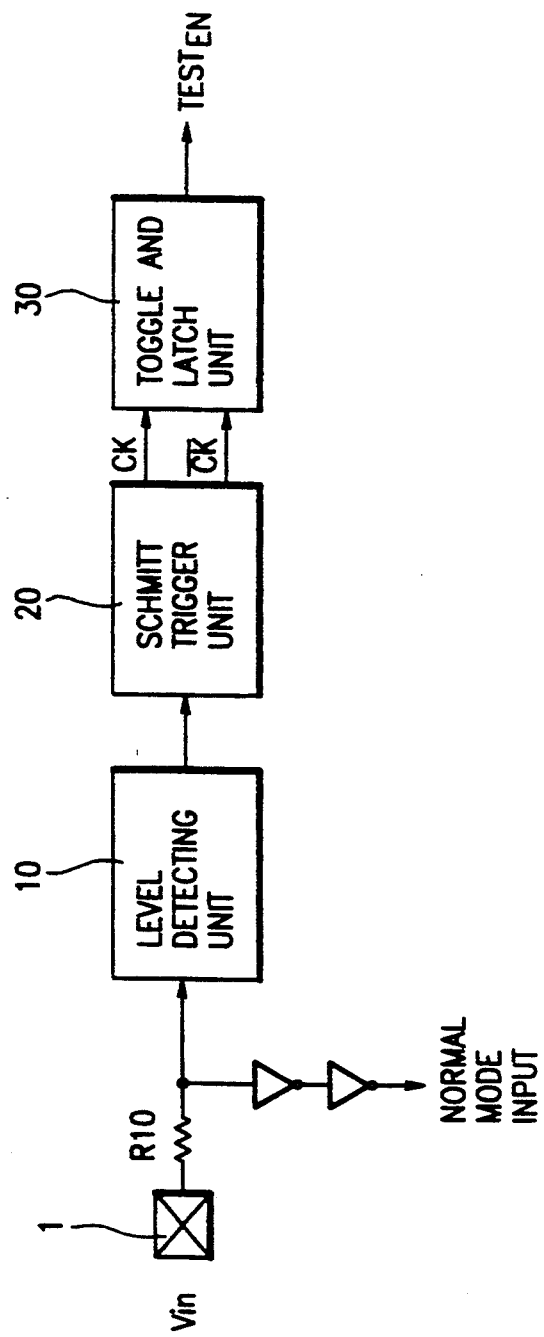
FIG. 2 is a block diagram of a momentary test mode enabling circuit according to the present invention.
Figure 3:
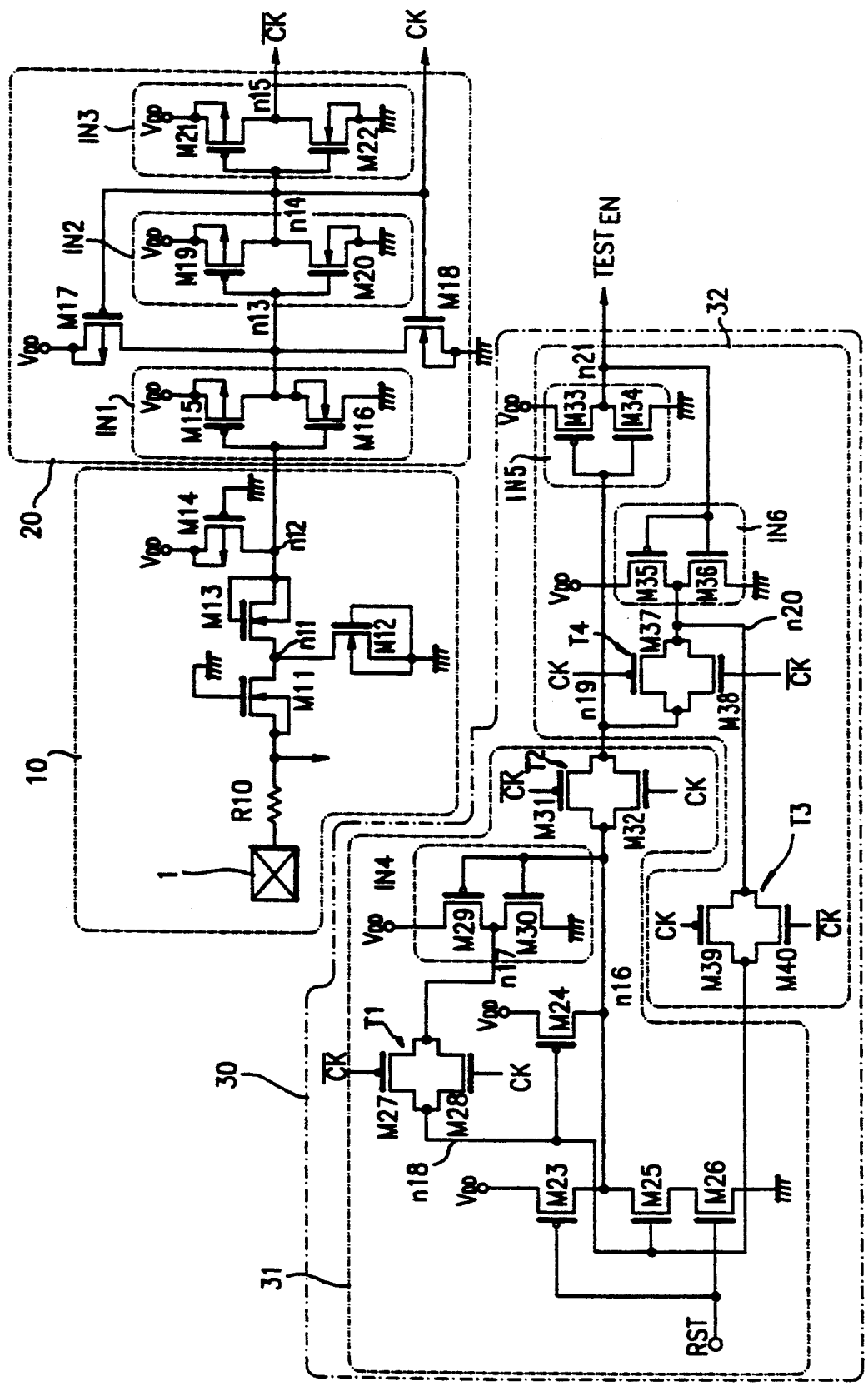
FIG. 3 is a detailed circuit diagram of the momentary test mode enabling circuit of the present invention.

Referring now in detail to the drawings for the purpose of illustrating preferred embodiments of the present invention, the momentary test mode enabling circuit as shown in FIGS. 2 and 3, comprises a level detecting unit 10 for detecting a level of an input signal $V_{IN}$ being inputted to an input pin 1, a Schmitt trigger unit 20 for stabilizing the level of the signal which has been detected at the level detecting unit 10 and outputting the stabilized signal as clock signals CK and $\overline{CK}$, and a toggle and latch unit 30 for outputting a test enabling signal $TEST_{EN}$ upon the control of the clock signals CK and $\overline{CK}$ of the Schmitt trigger unit 20.

The level detecting unit 10 comprises a first NMOS transistor M11 having a drain connected to the input pin 1 through a resistor R10 and a gate connected to the ground, a second NMOS transistor M12 having a drain connected to a source of the first NMOS transistor M11 and a gate and a source connected in common to the ground, a third NMOS transistor M13 having a drain connected to a connection node n11 between the drain of the second NMOS transistor M12 and the source of the first NMOS transistor M11 and a gate and a source connected in common to a level detection node n12, and a PMOS transistor M14 having a drain connected to the level detection node n12, a source connected to a power supply terminal $V_{DD}$ and a gate connected to the ground so that the level detecting unit 10 outputs a detection signal of a ground voltage level GND when the level of the input signal $V_{IN}$ being inputted to the input pin 1 is below the ground voltage level GND and a detection signal of a power source voltage level $V_{DD}$ when the level of the input signal $V_{IN}$ being inputted to the input pin 1 is greater than the ground voltage level GND.

The Shmitt trigger unit 20 comprises a first inverter gate IN1 including a PMOS transistor M15 and an NMOS transistor M16 each having a gate connected in common to a level detection node n12 of the level detecting unit 10 and a drain connected in common to a connection node n13, for inverting the output signal from the level detecting unit 10, a second inverter gate IN2 having a PMOS transistor M19 and an NMOS transistor M20 each having a gate connected in common to the connection node n13 and a drain connected in common to a non-inverting clock signal output node n14, for inverting the output signal from the first inverter gate IN1 and outputting a non-inverting clock signal CK, a PMOS transistor M17 having a gate connected to the output node n14 of the second inverter gate IN2, a source connected to a power source terminal $V_{DD}$, and a source connected to the connection node n13 between the first inverter gate IN1 and the second inverter gate IN2, for charging the connection node n13 with the power source voltage $V_{DD}$ by the non-inverting clock signal $\overline{CK}$, and NMOS transistor M18 having a gate connected to the output node n14 of the second inverter gate IN2, a source connected to the ground, and a drain connected to the connection node n13 between the first inverter gate IN1 and the second inverter gate IN2, for discharging the connection node n13 to the ground GND by the non-inverting clock signal CK, a third inverter gate IN3 including a PMOS transistor M21 and an NMOS transistor M22 each having a gate connected in common to the output node n14 of the second inverter gate IN2 and a drain connected in common to the inverting clock signal output node n15, for inverting the non-inverting clock signal CK into an inverting clock signal $\overline{CK}$.

The toggle and latch unit 30 comprises a toggle section 31 for generating and latching a control signal for generating a test mode enabling signal in response to the clock signals CK and $\overline{CK}$, from the Schmitt trigger unit 20, transmitting the control signal and toggling the control signal by a toggle signal being fedback, and a latch section 32 for outputting a test enabling signal TEST$_{EN}$ in response to the control signal being transmitted from the toggle section 31 upon the control of the clock signals $\overline{CK}$ and CK from the Schmitt trigger unit 20, latching the test enabling signal TEST$_{EN}$ and feeding back a toggle signal to the toggle section 31.

The toggle section 31 comprises a PMOS transistor M23 having a gate connected to a reset terminal RST, a source connected to a power source terminal $V_{DD}$, and a drain connected to a control signal generation node n16, for charging up the control signal generation node n16 by the reset signal RST, an NMOS transistor M26 for forming a discharge loop of the control signal generation node n16 upon the control of the reset signal RST, a fourth inverter gate including a PMOS transistor M29 and an NMOS transistor M30 each having a gate connected in common to the control signal generation node n16 and a drain connected in common, for inverting the control signal from the connection node n16, a first transmission gate T1 having a transmission node n17 connected to the output terminal of the fourth inverter gate IN4, for transmitting the output signal from the fourth inverter gate IN4 as a charge or discharge control signal of the control signal generation node n16 upon the control of the clock signals CK and $\overline{CK}$ of the Schmitt trigger unit 20, a PMOS transistor M24 having a gate connected in common to a transmission node n18 of the first transmission gate T1 and a toggle signal terminal which is fed back from the latch section 32, a source connected to a power source voltage $V_{DD}$, and a drain connected to the control signal generation node n16, for charging up the control signal generation node n16 in response to the output signal from the fourth inverter gate IN4 which has passed through the first inverter gate T1 and the toggle signal which is fed back from the latch section 32, an NMOS transistor M25 having a gate connected in common to the transmission node n18 of the first transmission gate T1 and the toggle signal terminal which is fedback from the latch section 32 and a drain connected to the control signal generation node n16, for controlling the discharge of the control signal generation node n16 between the control signal generation node n16 and the PMOS transistor M26 in response to the output signal from the fourth inverter gate IN4 which has passed through the first inverter gate IN1 and the toggle signal which is fedback from the latch section 32, and a second transmission gate T2 having one transmission node connected to the control signal generation node n16 and the other transmission node n19 connected to the control signal input terminal of the latch section 32, for transmitting the control signal from the control signal generation node n16 to the latch section 32 upon the control of the clock signals CK and $\overline{CK}$ from the Schmitt trigger unit 20.

The first transmission gate T1 comprises an NMOS transistor M28 having a gate for receiving the non-inverting clock signal CK from the Schmitt trigger unit 20, a PMOS transistor M27 having a gate for receiving the inverting clock signal CK from the Schmitt trigger unit 20, one side transmission node n17 connected to an output terminal of the fourth inverter gate IN4, and another side transmission node n18 connected in common to the gate of the PMOS transistor M24 and the gate of the NMOS transistor M25.

The second transmission gate T2 comprises an NMOS transistor M32 having a gate for receiving the non-inverting clock signal CK from the Schmitt trigger unit 20, a PMOS transistor M32 having a gate for receiving the inverting clock signal $\overline{CK}$ from the Schmitt trigger unit 20, a one side transmission node connected to the control signal generation node n16, and another side transmission node connected to an input node of the latch section 32.

The latch section 32 comprises a fifth inverter gate IN5 including a PMOS transistor M33 and an NMOS transistor M34 each having a gate connected in common to the transmission node n19 of the second transmission gate T2 of the toggle section 31 and a drain connected in common to the test enabling signal output node n21, for inverting the control signal and outputting a test enabling signal TEST$_{EN}$, a sixth inverter gate IN6 including a PMOS transistor M35 and an NMOS transistor M36 each having a gate connected in common to the test enabling signal output node n21 and a drain connected in common to a feedback node n20, for inverting and feeding back the test enabling signal TEST$_{EN}$, a third transmission gate T3 for feeding back the output signal from the sixth inverter gate IN6 to the toggle section 31 as a toggle signal upon the control of the clock signals $\overline{CK}$ and CK from the Schmitt trigger unit 20, and a fourth transmission gate T4 for feeding back the output signal from the sixth inverter gate IN6 to the fifth inverter gate IN5 as an input signal upon the control of the clock signals $\overline{CK}$ and CK from the Schmitt trigger unit 20.

The third transmission gate T3 comprises an NMOS transistor M40 having a gate for receiving the inverting clock signal $\overline{CK}$ from the Schmitt trigger unit 20, a PMOS transistor M39 having a gate for receiving the non-inverting clock signal $\overline{CK}$ from the Schmitt trigger unit, one side transmission node connected to the output terminal of the sixth inverter gate IN6, and another transmission node connected to the toggle signal feedback node of the toggle section 31.

The fourth transmission gate T4 comprises an NMOS transistor M38 having a gate for receiving the inverting clock signal $\overline{CK}$ from the Schmitt trigger unit 20, a PMOS transistor M37 having a gate for receiving the non-inverting clock signal CK from the Schmitt trigger unit 20, one side transmission node connected to an output terminal of the sixth inverter gate IN6, and another transmission node connected to an input terminal of the fifth inverter gate IN5.

The operations of the momentary test mode enabling circuit of the present invention will be described in detail with reference to FIGS. 4A to 4D.

When the input signal $V_{IN}$ input to the input pin 1 operates between the ground voltage GND and the power source voltage $V_{DD}$, the MOS transistors M11 and M13 are turned off and thus the level detection node n11 is charged up to the power source voltage level by virtue of the PMOS transistor M14. The high level signal at the level detection node n11 passes through the first and second inverter gates IN1 and IN2 of the Schmitt trigger unit 20 so that a high level non-inverting clock signal CK is output from the non-inverting clock signal output node n14, and the high level non-inverting clock signal CK is inverted into a low potential inverting clock signal $\overline{CK}$ by the third inverter gate IN3. At this moment, the NMOS transistor M16 of which the gate is connected to the output node n14 is turned on so that the level of the connection node n13 between the first inverter gate IN1 and the second inverter gate IN2 becomes a low level.

Meanwhile, since the non-inverting clock signal CK which is output from the Schmitt trigger unit 20 is a high level signal, the NMOS transistor M28 of the first transmission gate T1 and the NMOS transistor M32 of the second transmission gate T2 are turned on and since the inverting clock signal $\overline{CK}$ is a low level signal, the PMOS transistor M27 of the first transmission gate T1 and the PMOS transistor M31 of the second transmission gate T2 are turned on. In other words, the first and second transmission gates T1 and T2 of the toggle and latch unit 30 are turned on and the third and fourth transmission gates T3 and T4 are turned off by the high level non-inverting clock signal CK and the low level inverting signal $\overline{CK}$.

Under these states, when a reset signal RST is applied as a low level signal, the PMOS transistor M23 is turned on and the NMOS transistor M26 is turned off, so that the control signal generation node n16 is charged up to the power source voltage level $V_{DD}$ by the PMOS transistor M23. The high level signal at the control signal generation node n16 is transmitted to the fifth inverter gate IN5 of the latch section 32 through the second transmission gate T2 and inverted into a low level test enable signal $TEST_{EN}$ by the fifth inverter gate IN5 so as to be a test mode disabling state.

At this moment, since the first transmission gate T1 is in a turn-on state and the NMOS transistor M30 of the fourth inverter gate IN4 is turned on by the high level signal at the control signal generation node n16, the PMOS transistor M24 is turned on to charge up the control signal generation node n16 to the power source voltage level $V_{DD}$. Accordingly, the level of the control signal generation node n16 does not vary unless the clock signals CK and $\overline{CK}$ vary, even though the reset signal RST varies and thus a high level signal is applied. As a result, the test enabling signal $TEST_{EN}$ output from the latch section 32 is kept maintained at a low level state, thereby the test mode disabling state is maintained.

Figure 4A:
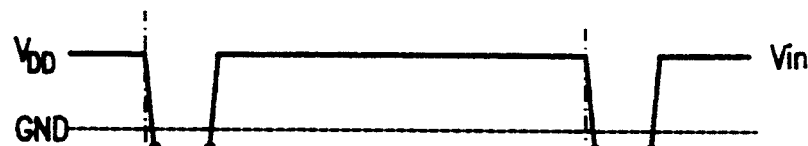
Figure 4B:

Thereafter, under such a normal state, when the level of the input signal $V_{IN}$ input to the input pin 1 becomes below GND$-2 V_{TN}$ (where, $V_{TN}$ is a threshold voltage of the MOS transistor), as shown in FIG. 4A, the NMOS transistors M11 and M13 of the level detecting unit 10 are turned on and thus the electric charge at the level detection node n12 is discharged. In other words, when the level of the input signal $V_{IN}$ is below GND$-2 V_{TN}$, the NMOS transistor M11 is turned on to cause the level at the connection node n11 to be below GND$-V_{TN}$, and as a result the NMOS transistor M13 is turned on to discharge the electric charge at the level detection node n12, so that the electric charge at the level detection node n2 becomes below the ground voltage level GND at the interval that the input signal $V_{IN}$ is negative level, as shown in FIG. 4B.

Figure 4C:

Accordingly, the signal at the level detection node n12 is inverted at the first inverter gate IN1 and then inverted again at the second inverter gate IN2 so that a low level non-inverting clock signal CK is output. And then, the low level non-inverting clock signal CK is inverted again at the third inverter gate IN3 so that an inverting clock signal $\overline{CK}$ is output as a high level signal at the interval that the input signal $V_{IN}$ is negative level, as shown in FIG. 4C.

Since the inverting clock signal $\overline{CK}$ output from the Schmitt trigger unit 20 is high level, the PMOS transistor M39 of the third transmission gate T3 and the PMOS transistor M37 of the fourth transmission gate T4 which receive the inverting clock signal $\overline{CK}$ through their gates are turned on, and at the same time since the non-inverting clock signal CK is low level, the NMOS transistor M40 of the third transmission gate T3 and the NMOS transistor M38 of the fourth transmission gate T4 which receive the non-inverting clock signal Ck are turned-on that is, the first and second transmission gates T1 and T2 of the toggle and latch unit 30 are turned off and the third and fourth transmission gates T3 and T4 are turned on in response to the low level non-inverting clock signal Ck and the high level inverting clock signal $\overline{CK}$.

Accordingly, since the first transmission gate T1 is turned off, the discharge loop of the node n18 to which the gates of the PMOS transistor M24 and the NMOS transistor M25 are connected is blocked. Instead, since the third transmission gate T3 of the latch section 32 is turned on, a high level signal being an output signal of the sixth inverter gate IN6 of the latch section 32 is applied to the gates of the PMOS transistor M24 and the NMOS transistor M25 through the third transmission gate T3. As a result, the PMOS transistor M24 is turned off and the NMOS transistor M25 is turned on. Accordingly, the electric charge at the control signal generation node n16 is discharged through the NMOS transistor M26 which is turned on by the NMOS transistor M25 and the reset signal RST. That is, the level of the control signal generation node n16 varies into low level, but is not transmitted to the latch section 32 since the second transmission gate T2 is in a turn-off state.

And, since the fourth transmission gate T4 of the latch section 32 is in a turn-on state, the high level signal output from the sixth inverter gate IN6 is fed back to the input node n19 of the fifth inverter gate IN5 through the fourth transmission gate T4. As a result, the test enabling signal $TEST_{EN}$ is kept maintained at low level so that the test mode is in a disabling state.

Thereafter, when the input signal $V_{IN}$ varies into a level between the GND and $V_{DD}$, the output level of the level detecting unit 10 becomes a high level signal so that the clock signals CK and $\overline{CK}$ from the Schmitt trigger unit 20 become a high level and low level signal, respectively. Accordingly, the first and second transmission gates T1 and T2 of the toggle and latch unit 30 are turned on and the third and fourth transmission gates T3 and T4 are turned off.

Accordingly, the low level signal at the control signal generation node n16 is applied to the fifth inverter gate IN5 through the second transmission gate T2, and at the same time the high level output signal from the fourth inverter gate IN4 is applied to the gate of the NMOS transistor M25 through the first transmission gate T1 so that the NMOS transistor M25 is maintained continuously at the turn-on state and the control signal generation node n16 is held maintained at a low level state.

And, the low level signal transmitted by the second transmission gate T2 is inverted at the fifth inverter gate IN5 so that a high level test enabling signal $TEST_{EN}$ is outputted, which enables the test mode. At this moment, the test enabling signal $TEST_{EN}$ is inverted at the sixth inverter gate IN6 and loaded to the feedback node n20 as a low level signal, while the test enabling signal $TEST_{EN}$ is maintained at a high level signal since the third and fourth transmission gates T4 are in a turn-off state.

Thereafter, when the level of the input signal $V_{IN}$ becomes below $GND - 2\ V_{TN}$, the output signal from the level detecting unit 10 becomes low level so that a low level clock signal CK and a high level clock signal $\overline{CK}$ are output from the Schmitt trigger unit 20. Accordingly, the first and second transmission gates T1 and T2 of the toggle and latch unit 30 are turned off and the third and fourth transmission gates T3 and T4 are turned on.

Accordingly, as a result of turning-on the fourth transmission gate T4, the low level output signal from the sixth inverter gate IN6 is fed back to the fifth inverter gate IN5 as an input signal so that the test enabling signal $TEST_{EN}$ is maintained at high level. And, as a result of turning-on the third transmission gate T3, the electric charge at the node n18 is discharged through the NMOS transistor M36 of the sixth inverter gate IN6. Accordingly, the NMOS transistor M25 is turned off and the PMOS transistor M24 is turned on so that the control signal generation node n16 is charged up to the power source voltage level $V_{DD}$. At this moment, since the first and second transmission gates T1 and T2 are in a turn-off state, the test enabling signal $TEST_{EN}$ is maintained at high level without variation even though the level at the control signal generation node n16 is high.

Thereafter, when the level of the input signal $V_{IN}$ is restored to between the GND and $V_{DD}$, the output level from the level detecting unit 10 becomes high to cause the clock signals CK and $\overline{CK}$ outputted from the Schmitt trigger unit 20 to become high and low level, respectively. Accordingly, the first and second transmission gates T1 and T2 of the togle and latch unit 30 are turned on and the third and fourth transmission gates T3 and T4 are turned off.

Consequently, the high level signal at the control signal generation node n16 is applied to the fifth inverter gate IN5 as an input signal through the second transmission gate T2 which has already been turned on. At the same time, the low level output signal from the fourth inverter gate IN4 is applied to the gates of the PMOS transistor M24 and the NMOS transistor M25 through the first transmission gate T1, and as a result, the PMOS transistor M24 is turned on and the NMOS transistor M25 is turned off. Accordingly, the control signal generation node n16 is continuously maintained at high level.

Also, the high level signal which has been transferred by the second transmission gate T2 is inverted at the fifth inverter gate IN5 so that a low level test enabling signal $TEST_{EN}$ is output. That is, a signal for disabling the test mode is output. At this moment, the test enabling signal $TEST_{EN}$ is inverted at the sixth inverter gate IN6 and loaded to the feedback node n20 as a low level signal, but since the third and fourth transmission gates T3 and T4 are in a turn-off state, the test enabling signal $TEST_{EN}$ is held maintained at a high level.

Figure 4D:
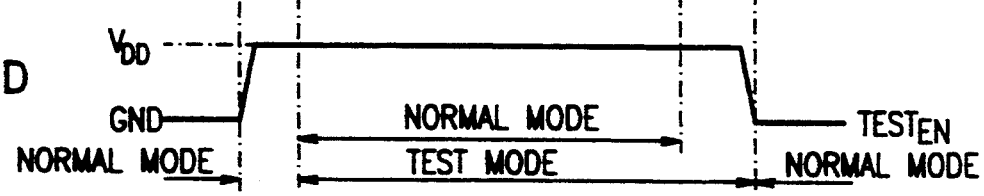

Accordingly, in the momentary test mode enabling circuit of the present invention, when the input signal $V_{IN}$ being input to the input pin 1 becomes below $GND - 2\ V_{TN}$, as shown in FIG. 4A, a clock signal $\overline{CK}$, as shown in FIG. 4C, is output from the Schmitt trigger 20. And the toggle section 31 of the toggle and latch unit 30 is toggled in response to the clock signal CK from the Schmitt trigger unit 20 so as to be in a state to generate a test enabling signal and then a control signal is loaded to the latch section 32. Thereafter, when the input signal $V_{IN}$ has a level between the GND and $V_{DD}$, i.e., when it becomes a normal input state, a test enabling signal $TEST_{EN}$ which enables the test mode is output, as a high level signal, as shown in FIG. 4D, from the latch section 32 by the control signal of the toggle section 31. Accordingly, under the state that the test mode is enabled, since the test enable signal $TEST_{EN}$ maintains its state to enable the test mode even though a normal operational input between GND and $V_{DD}$ is applied to the input pin 1, it is possible to use the input pin 1 as an input port for a normal operational mode even in case that the test mode is enabled.

When the input signal $V_{IN}$ has a level below $GND - 2\ V_{TN}$, the toggle section 31 is toggled and a control signal for disabling the test mode is generated, while a test enabling signal $TEST_{EN}$ for enabling the test mode is continuously output from the latch section 32. Thereafter, when it becomes again a normal operational input mode in which the input signal $V_{IN}$ has a level between GND and $V_{DD}$, a test enabling signal $TEST_{EN}$ for disabling the test mode is outputted from the latch section 31 in response to the control signal from the toggle section 31. Thereafter, as the input signal $V_{IN}$ becomes a negative signal, a test enabling signal $TEST_{EN}$ is output upon carrying out the toggling and latching operations, as described above.

As described above in detail, the present invention provides the effect that it is possible to input a normal operational input to the input pin even in case that the test mode is being enabled so that the input pin may be used for other purposes. And, since the test mode is enabled by toggling a negative input signal, the test mode enabling, and disabling operations may be easily carried out by a momentary variation of the input signal. Further, since the input level detection signal is stabilized by the Schmitt trigger circuit, the noise margin can be extremely increased.

The invention being thus described, it will be obvious that the same may be varied in many ways. Such variations are not to be regarded as a departure from the spirit and scope of the invention, and all such modifications as would be obvious to one skilled in the art are intended to be included in the scope of the following claims.

What is claimed is:

1. A momentary test mode enabling circuit, comprising:

a level detecting unit for detecting a level of an input signal being inputted to an input pin;

a Schmitt trigger unit for stabilizing the level of a signal detected at the level detecting unit and outputting the stabilized signal as clock signals; and a toggle and latch unit for outputting a test enabling signal upon the control of the clock signals from the Schmitt trigger unit;

wherein said level detecting unit includes:

a first NMOS transistor having a drain connected to the input pin through a resistor and a gate connected to the ground;

a second NMOS transistor having a drain connected to a source of said first MOS transistor and a gate and a source connected in common to the ground;

a third NMOS transistor having a drain connected to a connection node between the drain of the second NMOS transistor and the source of the first NMOS transistor and a gate and a source connected in common to a level detection node; and a PMOS transistor having a drain connected to the level detection node, a source connected to a power supply terminal and a gate connected to the ground, and wherein said level detecting unit outputs a detection signal of a ground voltage level when the level of the input signal being inputted to the input pin is below the ground voltage level and a detection signal of a power source voltage level when the level of the input signal being inputted to the input pin is greater that the ground voltage level.

2. The circuit of claim 1, wherein said Schmitt trigger unit includes:

a first inverter gate for inverting an output signal from the level detecting unit;

a second inverter gate for inverting an output signal from said first inverter gate and outputting a non-inverting clock signal;

a second PMOS transistor for charging up a connection node between the first inverter gate and the second inverter gate with the power supply voltage upon the control of the non-inverting clock signal from the second inverter gate;

an NMOS transistor for discharging the connection node between the first inverter gate and the second inverter gate into the ground voltage upon the control of the non-inverting clock signal from the second inverter gate; and a third inverter gate for inverting the non-inverting clock signal from the second inverter gate into an inverting clock signal.

3. The circuit of claim 2, wherein said toggle and latch unit includes:

a toggle section for generating and latching a control signal for generating a test mode enabling signal in response to the clock signals from the Schmitt trigger unit, transmitting the control signal and toggling the control signal by a toggle signal being fedback; and a latch section for outputting a test enabling signal in response to the control signal being transmitted from the toggle section upon the control of the clock signals from the Schmitt trigger unit, latching the test enabling signal and feeding back a toggle signal to the toggle section.

4. The circuit of claim 3, wherein said toggle section includes:

a PMOS transistor for charging up a control signal generation node upon the control of a reset signal;

an NMOS transistor for forming a discharge loop of the control signal generation node upon the control of the reset signal;

a fourth inverter gate for inverting the control signal from the control signal generation node;

a first transmission gate for transmitting an output signal from the fourth inverter gate as a charge control signal or a discharge control signal of the control signal generation node upon the control of the clock signals from the Schmitt trigger unit;

a PMOS transistor for charging up the control signal generation node between the control signal generation node and the NMOS transistor based on the output signal from the fourth inverter gate which has passed through the first transmission gate and the toggle signal which has been fedback at the latch section; and a second transmission gate for transmitting the control signal from the control signal generation node to the latch section upon the control of the clock signals from the Schmitt trigger unit.

5. The circuit of claim 4, wherein said first transmission gate includes:

an NMOS transistor having a gate for receiving the non-inverting clock signal from the Schmitt trigger unit;

a PMOS transistor having a gate for receiving the inverting clock signal from the Schmitt trigger unit;

a one side transmission node connected to an output terminal of the fourth inverter gate; and another side transmission node connected in common to the gate of the PMOS transistor and the gate of the NMOS transistor.

6. The circuit of claim 5, wherein said second transmission gate includes:

an NMOS transistor having a gate for receiving the non-inverting clock signal from the Schmitt trigger unit;

a PMOS transistor having a gate for receiving the inverting clock signal from the Schmitt trigger unit;

one side transmission node connected to the control signal generation node; and another side transmission node connected to an input node of the latch section.

7. The circuit of claim 6, wherein said latch section includes:

a fifth inverter gate for inverting a control signal for generating the test mode enabling signal transmitted from the toggle section and outputting a test enabling signal;

a sixth inverter gate for inverting the test enabling signal;

a third transmission gate for feeding back an output signal from the sixth inverter gate to the toggle section as a toggle signal upon the control of the clock signals from the Schmitt trigger unit; and a fourth transmission gate for feeding back an output signal from the sixth inverter gate to the fifth inverter gate as an input signal upon the control of the clock signals from the Schmitt trigger unit.

8. The circuit of claim 7, wherein said third transmission gate includes:

an NMOS transistor having a gate for receiving the inverting clock signal of the Schmitt trigger unit;

a PMOS transistor having a gate for receiving the non-inverting clock signal of the Schmitt trigger unit;

one side transmission node connected to an output terminal of the sixth inverter gate; and another transmission node connected to a toggle signal feedback node of the toggle section.

9. The circuit of claim 8, wherein said fourth transmission gate includes:

an NMOS transistor having a gate for receiving the inverting clock signal from the Schmitt trigger unit;

a PMOS transistor having a gate for receiving the non-inverting clock signal from the Schmitt trigger unit;

one side transmission node connected to an output terminal of the sixth inverter gate; and another transmission node connected to an input terminal of the fifth inverter gate.

* * * * *